Jan. 17, 1967 J. M. CLUWEN 3,299,281

TRANSISTOR ELEMENT AND TRANSISTOR CIRCUIT

Filed Dec. 1, 1953

United States Patent Office 3,299,281

Patented Jan. 17, 1967

3,299,281
TRANSISTOR ELEMENT AND TRANSISTOR CIRCUIT

Johannes Meyer Cluwen, Eindhoven, Netherlands, assignor, by mesne assignments, to North American Philips Company, Inc., New York, N.Y., a corporation of Delaware Filed Dec. 1, 1953, Ser. No. 395,550
Claims priority, application Netherlands, Dec. 1, 1952, 174,267
20 Claims. (Cl. 307—88.5)

The invention relates to a transistor element made of a semi-conductive mass of one conductivity type comprising zones of the other conductivity type, this mass and at least a few of the zones being provided with connecting electrodes, and to a circuit comprising such a transistor element, the invention having for its object to provide a universal transistor element with many possibilities of connection due to a particular realisation of the transistor element.

In accordance with the invention, at least two zones, provided with connection electrodes, are arranged each at a distance from a third zone provided or not provided with a connecting terminal, which distance is smaller than the characteristic diffusion length of the minority carriers in the mass, the relative distance between the first zone and the second zone exceeding this characteristic diffusion length.

In order the the invention may be readily carried into effect, it will now be described with reference to the accompanying drawing.

Figure 1:
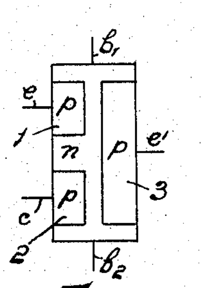
FIG. 1 shows a transistor element according to the invention.

FIG. 1 shows a transistor element according to the invention comprising a comparatively high-resistivity, semi-conductive mass *n* of one conductivity type (n), in which comparatively high-resistivity zones 1, 2 and 3 of the other or opposite conductivity type (p) are preferably provided. Such zones may, for example, be obtained by causing a suitable material to diffuse at a definite temperaure and for a definite time into the mass *n*. The transistor element is provided with connecting electrodes *e* and *c*, connected to the p-zones 1 and 2 and adapted to serve as the emitter electrode and the collector electrode respectively, and the connecting electrodes $b_1$ and $b_2$, of which at least one operates as a base electrode, while the third p-zone 3 is provided with a connecting electrode *e'*.

The operation of the transistor is, as is known, based on the following principle. In a p-zone, the majority carriers are holes, and in an n-zone, electrons. However, in the case of a p-n junction biased in the forward direction holes in the n-zone, and also electrons in the p-zone, will diffuse over a definite distance, termed the characteristic diffusion length, before recombining and disappearing, these holes forming, it is true, the minority carriers in this n-zone, but permitting the current to pass to an n-p junction following the n-zone and biased in its blocking direction, if the thickness of the n-zone is smaller than this characteristic diffusion length.

The distance between the zones 1–3 and 2–3 is smaller than the characteristic diffusion length of the minority carriers in the mass *n*, so that the portions 1–*n*–3 and 2–*n*–3 respectively of the transistor element, provided with the connecting electrodes $e$–$b_1$–$e'$ and $c$–$b_2$–$e'$ respectively, may be connected each as a transistor amplifier. The relative distance between the zones 1 and 2, however, exceeds this characteristic diffusion length, so that a direct transistor action between the portions 1–*n*–2 of the transistor element is avoided.

Figure 2:
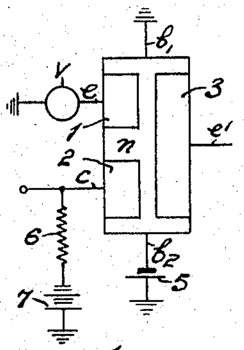
FIG. 2 shows a circuit arrangement comprising such an element for amplifying an electric signal.

A transistor element as shown in FIG. 1 may be used with advantage in the amplifying circuit shown in FIG. 2. The input signal V to be amplified is supplied to the emitter electrode *e* and the base electrode $b_1$ is connected to earth or ground. The electrode *e'* is floating and could, if desired, be omitted. The electrode $b_2$ is connected to earth through a voltage source 5, having a low internal resistance at least for the high signal frequencies and a voltage of a few volts only, while the collector electrode *c* is connected to earth through a comparatively high output impedance 6 and a supply voltage source 7.

The circuit operates as follows: Owing to the voltage source 5, the p–n junction between the zone 1 and the mass *n* is operated in the forward direction. The same applies to the p–n transition between the zone 3 and the mass *n* in the proximity of the zone 2. Thus signal current flows from the voltage source V through the emitter electrode *e*, the zone 1, the mass *n*, the zone 3, the mass *n*, the zone 2 and the collector electrode *c* to the output impedance 6, a voltage amplification being thus obtained, since the input impedance for the signal source V is lower than the impedance 6. At the same time a capacitative reaction of the output voltage through the impedance 6 and internal transistor capacities on the signal source V and hence a decrease in limit frequency for the operation of the transistor is avoided, since the zone 3 is at a substantially constant potential (i.e. slightly less negative than the electrode $b_2$ with respect to earth), so that the internal transistor capacity between the zone 3 and the mass *n* has substantially no detrimental effect in the proximity of the zone 1.

In order to limit the direct current flowing through the mass *n* from the electrode $b_1$ to the electrode $b_2$, a mass *n* having an increased specific resistivity compared with conventional transistors may be used. The disadvantage normally attended herewith, that thus also the base resistivity of the transistor is increased and the limit frequency for the operation of the transistor is decreased, does not occur in the present case, since the base resistivity occurring at the base electrode $b_2$ may be kept low by suitable choice of the voltage source 5, while the base resistivity occurring at the electrode $b_1$ does substantially not affect the limit frequency, as stated above.

Figure 3:
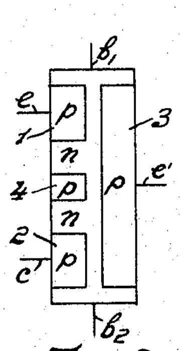
FIGS. 3 and 4 show two variants of the element shown in FIG. 1.

A further method to increase the resistivity between the two base electrodes $b_1$ and $b_2$ is shown in FIG. 3. Herein a fourth zone 4 is provided between the zones 1 and 2 and opposite the third zone, which zone 4 is normally floating, so that the sectional area of the mass *n* for the current flowing from the base electrode $b_1$ to the base electrode $b_2$ is materially reduced at the area of the zone 4. The zone 4 may, if desired, be in contact with the zone 3.

In order to facilitate the manufacture of the zone 3 under certain conditions, it may be made, if desired, of two separate, electrically interconnected zones, arranged opposite the zones 1 and 2 respectively.

Figure 4:
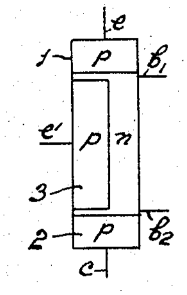

FIG. 4 shows a further embodiment in which the current passing through the mass *n* from the base electrode $b_1$ to the base electrode $b_2$ affects only little the transistor operation between the portions 1–*n*–3 and 3–*n*–2 respectively, the three zones 1, 3 and 2 being adjacent one another in the transistor element.

Figure 5:
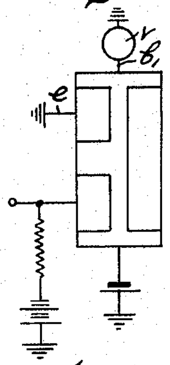
FIG. 5 shows a variant of the circuit shown in FIG. 2.

FIG. 5 shows a variant of the circuit shown in FIG. 2, in which the voltage source V is included in the circuit of the base electrode $b_1$, while the emitter electrode $e$ is connected to earth. The circuit operates in a manner similar to that of the circuit shown in FIG. 2.

Figure 6:
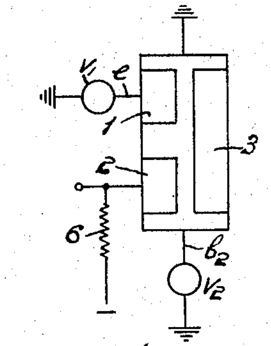
FIG. 6 shows a gating circuit comprising a transistor element according to the invention.

FIG. 6 shows a variant of the circuit shown in FIG. 2, in which the direct voltage source 5 is replaced by an alternating voltage source $V_2$, for example, a pulsatory voltage or a square-wave voltage. As long as this voltage renders the electrode $b_2$ positive relative to earth, the portions 3–$n$–2 cannot operate as a transistor, so that independently of the value of the voltage source $V_1$, no signal voltage is produced across the output impedance 6. However, when the electrode $b_2$ becomes negative relative to earth, the required bias voltage for a satisfactory transistor operation of the portions 1–$n$–3 and 3–$n$–2 is at the same time obtained, so that a signal voltage varying with the source $V_1$ is produced across the output impedance 6.

If desired, the voltage of the source $V_2$ may be varied in some way or other with that of the source $V_1$. An example thereof is given in the amplitude detector circuit shown in FIG. 7, in which part of the input voltage V is supplied in one phase to the emitter electrode $e$ and part of it in the opposite phase to the base electrode $b_2$. Thus only during one phase of the voltage V current flows to the collector electrode $c$, so that subsequently to smoothing with the aid of a collector capacitor 10, a voltage corresponding to the amplitude of the voltage V is produced across the output impedance 6.

Figure 7:
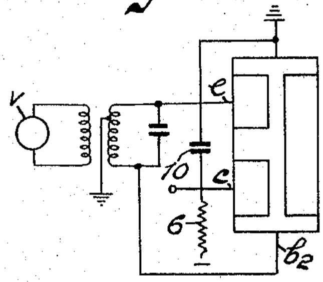
FIG. 7 shows a similar amplitude-detector circuit.
Figure 8:
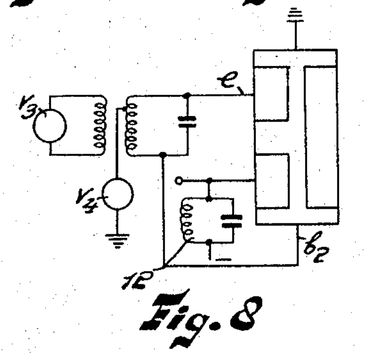
FIG. 8 shows a variant of the circuit shown in FIG. 7.

FIG. 8 shows a variant of the circuit shown in FIG. 7, for modulating two signals supplied by the sources $V_3$ and $V_4$ respectively. In this case the voltages from the source $V_3$, supplied to the emitter electrode $e$ and the base electrode $b_2$ are adjusted in a manner such that no current flows from the source $V_3$ directly through the circuit of the source $V_4$, so that a reaction of the source $V_3$ on the source $V_4$ is avoided. On the other hand the current flowing via the collector electrode $c$ through the output impedance 12, selective for a mixed frequency varies with the two sources $V_3$ and $V_4$, so that a mixed oscillation is produced across this output impedance 12.

In all these circuits it is important to include decoupled resistors for the signal oscillations in the emitter circuit and/or one of the base circuits of the transistor, in order to reduce the natural drift of the working point of the circuit. As a matter of course, the earth connection in the circuits shown may be provided at a different area in the arrangement.

Figure 9:
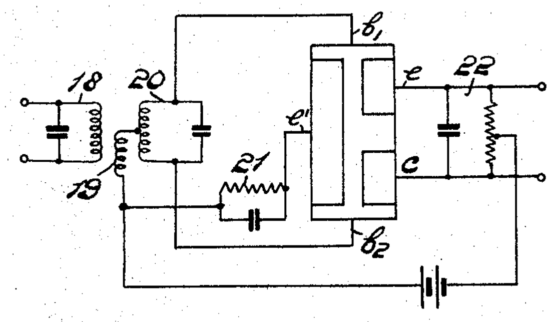
FIG. 9 shows a frequency-demodulator circuit comprising a transistor element according to the invention.

FIG. 9 shows a further possibility of connecting a transistor element according to the invention, i.e. a circuit for demodulating a frequency-modulated signal. For this purpose the signal is supplied through two substantially critically coupled circuits 18 and 20; a tapping of the circuit 20 is connected via an inductor 19, coupled fixedly with the circuit 18, to the electrode $e'$, operating as the emitter electrode, of the transistor element, while the ends of the circuit 20 are connected to the two base electrodes $b_1$ and $b_2$ respectively. Thus a voltage difference substantially proportional to the frequency sweep of the signal across the circuit 18 is produced across the intermediate-frequency smoothing filter 22 between the electrodes $e$ and $c$, operating as collector electrodes. A filter 21 included in the circuit of the emitter electrode $e'$, having a high impedance for undesired amplitude modulations of the signal, serves to suppress this amplitude modulation.

The invention provides numerous other variants of circuits than those indicated. As a matter of course, the n- and p-zones may be interchanged in the drawing, if the polarities of the voltage sources are reversed.

What is claimed is:

1. A transistor comprising a semi-conductive body of one conductivity type, at least three spaced zones within the body of a conductivity type opposite to said one conductivity type, two of said zones each being spaced from a third zone by semi-conductive material of said one type having a thickness smaller than the characteristic diffusion length of minority carriers in said one type material, said two zones being spaced from each other by semi-conductive material of said one type having a thickness greater than said characteristic diffusion length, a pair of connections secured to said body of said one type material at spaced positions, and connections secured to at least said two zones of said opposite type material.

2. A transistor as claimed in claim 1 wherein the pair of connections secured to said body are secured to opposite ends of the body each in the vicinity of one of said two zones.

3. A transistor as claimed in claim 2 wherein means are provided for increasing the electrical resistivity of the semiconductive body between said pair of connections.

4. A transistor comprising a semi-conductive body of N-type material, three spaced zones of P-type material within the body, two of said zones being smaller than said third zone and lying on one surface of said body and being spaced by N-type material, the third zone lying on the opposite surface of said body and being spaced from each of said two zones by N-type material, the spacing between each of said two zones and said third zone being less than the characteristic diffusion length of minority carriers in said N-type material, the spacing between said two zones being greater than said characteristic diffusion length, terminal means secured to said two zones, and terminal means secured to said body at opposite ends thereof with the three zones therebetween.

5. A circuit arrangement including a transistor element comprising a semi-conductive body of one conductivity type, at least three spaced zones within the body of a conductivity type opposite to said one conductivity type, two of said zones each being spaced from said third zone by semi-conductive material of said one type having a thickness smaller than the characteristic diffusion length of minority carriers in said one type material, said two zones being spaced from each other by semi-conductive material of said one type having a thickness greater than said characteristic diffusion length, a pair of terminal means secured to said body of said one type material each in the vicinity of one of said two zones, terminal means secured to said two zones of said opposite type material, a source of signals connected between a terminal of one of said two zones and the terminal to the body in the vicinity of said one zone, means coupled to the terminal of the other of said two zones for deriving an amplified signal therefrom, and a source of D.C. potential connected to the other terminal to the body.

6. A circuit arrangement as claimed in claim 5 wherein a source of potential is coupled to the terminal of the other of said two zones.

7. A circuit arrangement including a transistor element comprising a semi-conductive body of one conductivity type, at least three spaced zones within the body of a conductivity type opposite to said one type, two of said zones each being spaced from said third zone by semi-conductive material of said one type having a thickness smaller than the characteristic diffusion length of minority carriers in said one type material, said two zones being spaced from each other by semi-conductive material of said one type having a thickness greater than said characteristic diffusion length, a pair of terminal means secured to said body of said one type material each in the vicinity of one of said two zones, terminal means secured to said two zones of said opposite type material, a source of signals connected between a terminal of one of said two zones and the terminal to the body in the vicinity of said one zone, means coupled to the terminal of the other of said two zones for deriving an amplified signal therefrom, and a second source of signals connected to the other terminal to the body.

8. A circuit arrangement as claimed in claim 7 wherein the second source of signals produces a square-wave signal functioning as a gating signal.

9. A circuit arrangement including a transistor element comprising a semi-conductive body of one conductivity type, at least three spaced zones within the body of a conductivity type opposite to said one conductivity type, two of said zones each being spaced from said third zone by semi-conductive material of said one type having a thickness smaller than the characteristic diffusion length of minority carriers in said one type material, said two zones being spaced from each other by semi-conductive material of said one type having a thickness greater than said characteristic diffusion length, a pair of terminal means secured to said body of said one type material each in the vicinity of one of said two zones, terminal means secured to said two zones of said opposite type material, a source of signals, and means for supplying said signals in phase opposition to a terminal to one of said two zones and to the terminal to the body in the vicinity of the other of said two zones.

10. A circuit arrangement as claimed in claim 9 wherein means are coupled to the terminal of the other of said two zones for deriving an output signal therefrom.

11. A circuit arrangement including a transistor element comprising a semi-conductive body of one conductivity type, at least three spaced zones within the body of a conductivity type opposite to said one conductivity type, two of said zones each being spaced from said third zone by semi-conductive material of said one type having a thickness smaller than the characteristic diffusion length of minority carriers in said one type material, said two zones being spaced from each other by semi-conductive material of said one type having a thickness greater than said characteristic diffusion length, a pair of terminal means secured to said body of said one type material each in the vicinity of one of said two zones, terminal means secured to said three zones of said opposite type material, a source of signals, means for supplying said signal in phase opposition to said terminals secured to said body, means for coupling said signal with a phase difference varying with signal frequency to the third zone, and means coupled to said two zones for deriving an output signal therefrom.

12. A semiconductor device comprising in combination a body of semiconductor material of one carrier type having a pair of opposed surfaces, an emitter mounted on one of said surfaces to form a junction of predetermined area therewith, a pair of collectors mounted on the other of said surfaces to form junctions of predetermined area therewith, each of said collector junctions being separated from said emitter junction by a distance sufficiently small to permit an appreciable number of carriers injected across said emitter junction to reach each of said collector junctions by diffusion, at least a portion of said emitter junction being directly opposite each of said collector junctions, and means independent of said emitter and collector junctions for establishing different electrostatic potentials at different points of said body adjacent to said emitter in response to suitably applied voltages.

13. In combination, a body of semiconductor material of one carrier type having a pair of opposed surfaces, an emitter mounted on one of said surfaces to form a junction of predetermined area therewith, a pair of collectors mounted on the other of said surfaces to form junctions of predetermined area therewith, each of said collector junctions being separated from said emitter junction by a distance sufficiently small to permit an appreciable number of carriers injected across said emitter junction to reach each of said collector junctions by diffusion, at least a portion of said emitter junction being directly opposite each of said collector junctions, means for making contact to said emitter, said collectors and said body, means for interconnecting the contact means including a source of voltage, a signal source, and circuit elements to cause a flow of current from said emitter to said collectors, means independent of said emitter or collector for establishing different electrostatic potentials at different points on said body adjacent to said emitter in response to suitably applied voltages for varying current flow from said emitter to said collectors.

14. In combination, a body of semiconductor material of one carrier type having a pair of opposed surfaces, an emitter mounted on one of said surfaces to form a junction of predetermined area therewith, a pair of collectors mounted on the other of said surfaces to form a junction of predetermined area therewith, each of said collectors being separated from said emitter junction by a distance sufficiently small to permit an appreciable number of carriers injected across said emitter junction to reach each of said collector junctions by diffusion, at least a portion of said emitter junction being directly opposite a respective portion of each of said collector junctions, a pair of contacts for establishing different electrostatic potentials at different points of said body adjacent to said emitter in response to suitably applied voltages, means for applying signals between said emitter and each of said contacts for producing current flow from said emitter to said collectors, and means for deriving an output current between each of said collectors and a respective contact of said pair of contacts.

15. A circuit including a semiconductor device comprising a body of semiconductor material, an input emitter electrode and a plurality of collector electrodes mounted on said body, a pair of base electrodes mounted on said body, a signal source connected between both of said base electrodes and said emitter, and another signal source connected between said base electrodes for applying an electric field along said device substantially transversely of the paths between said emitter electrode and said collector electrodes.

16. A circuit including a semiconductor device comprising a body of semiconductor material, an input emitter electrode and a pair of collector electrodes mounted on said body, a pair of base electrodes mounted on said body, a signal source connected between both of said base electrodes and said emitter electrode, and another signal source connected between said base electrodes for applying an alternating field across said body and switching the current from said emitter to one or the other of said collector electrodes.

17. A semiconductor device comprising an elongated body of semiconductor material, an emitter rectifying electrode and a pair of collector rectifying electrodes mounted on said body, a plurality of base non-rectifying electrodes mounted on said body at the ends thereof, means connected to said emitter electrode for applying a first signal thereto and means connected between said base electrodes for applying a second signal therebetween and establishing an electric field through said body for switching the current from said emitter to one or the other of said collector electrodes.

18. A circuit including a semiconductor device comprising an elongated body of semiconductor material of one conductivity type, an emitter rectifying electrode of opposite conductivity type mounted on one surface of said body and a pair of collector rectifying electrodes of opposite conductivity type mounted on the opposite surface of said body, a pair of non-rectifying base electrodes connected to said body at opposite ends thereof, a first signal source connected to said emitter electrode, and another signal source connected between said base electrodes whereby a current controlling field is applied to said body between said base electrodes.

19. A transistor comprising a semi-conductive body of P-type material, three spaced zones of N-type material within the body, two of said zones being smaller than said third zone and lying on one surface of said body and being spaced by P-type material, the third zone lying on the opposite surface of said body and being spaced from each of said two zones by P-type material, the spacing between each of said two zones and said third zone being less than the characteristic diffusion length of minority carriers in said P-type material, the spacing between said two zones being greater than said characteristic diffusion length, terminal means secured to said two zones, and terminal means secured to said body at opposite ends thereof with the three zones therebetween.

20. A semiconductor device comprising a body of semiconductor material of a particular conductivity type and having two opposed surfaces; a first rectifying electrode on one of said surfaces; a plurality of second rectifying electrodes on the other of said surfaces, each combination of a first and a second rectifying electrode defining the ends of a charge carrier path therebetween; a pair of nonrectifying electrodes positioned on said body along an axis transverse to said charge carrier paths and capable of establishing an electric field transverse to and intersecting said paths when a voltage is applied thereto, and means for applying voltages to the electrodes at which current is caused to flow between the rectifying electrodes on opposed surfaces along the said charge carrier paths.

References Cited by the Examiner

UNITED STATES PATENTS

| | | | |
|---|---|---|---|
| 2,095,998 | 10/1937 | McNary | 250—21 |
| 2,100,458 | 11/1937 | Walter | 250—21 |
| 2,569,347 | 9/1951 | Shockley | 307—88.5 |
| 2,600,500 | 6/1952 | Haynes et al. | 179—171 |
| 2,644,859 | 7/1953 | Barton | 179—171 |
| 2,655,610 | 10/1953 | Ebers | 307—88.5 |
| 2,657,360 | 10/1953 | Wallace | 250—36.24 |
| 2,663,806 | 12/1953 | Darlington | 307—88.5 |
| 2,666,814 | 1/1954 | Shockley | 307—88.5 |
| 2,742,383 | 4/1956 | Barnes et al. | 307—88.5 |
| 2,754,431 | 7/1956 | Johnson | 307—88.8 |
| 2,801,347 | 7/1957 | Dodge | 307—88.5 |

ARTHUR GAUSS, *Primary Examiner.*

GEORGE N. WESTBY, SAMUEL BERNSTEIN, BENNETT G. MILLER, SIMON YAFFE, *Examiners.*

A. B. GOODALL, K. O. CORLEY, P. F. URBACH, R. LAKE, W. K. TAYLOR, Z. ZAZWORSKY, J. W. HUCKERT, *Assistant Examiners.*